United States Patent [19]
Leach et al.

[11] Patent Number: 5,347,217
[45] Date of Patent: Sep. 13, 1994

[54] MAGNETIC RESONANCE SPECTROSCOPY AND IMAGING

[75] Inventors: Martin O. Leach, Wallington; Jonathan C. Sharp, Leicester, both of United Kingdom

[73] Assignee: British Technology Group Limited, London, United Kingdom

[21] Appl. No.: 966,158
[22] PCT Filed: Jul. 25, 1991
[86] PCT No.: PCT/GB91/01247
§ 371 Date: Mar. 5, 1993
§ 102(e) Date: Mar. 5, 1993
[87] PCT Pub. No.: WO92/02828
PCT Pub. Date: Feb. 20, 1992

[30] Foreign Application Priority Data
Aug. 2, 1990 [GB] United Kingdom ............ 9016989.7

[51] Int. Cl.$^5$ .................................................. G01R 33/00
[52] U.S. Cl. ...................................... 324/309; 324/307
[58] Field of Search ........................ 324/309, 307, 300

[56] References Cited

U.S. PATENT DOCUMENTS

| | | | |
|---|---|---|---|
| 4,509,015 | 4/1985 | Ordidge et al. | 324/309 |
| 4,535,290 | 8/1985 | Post et al. | 324/309 |
| 4,766,380 | 8/1988 | Den Boef et al. | 324/309 |
| 4,891,595 | 1/1990 | Granot | 324/309 |
| 4,947,119 | 8/1990 | Ugurbil et al. | 324/307 |
| 5,049,820 | 9/1991 | Briand et al. | 324/309 |
| 5,248,942 | 9/1993 | Ratzel et al. | 324/309 |

FOREIGN PATENT DOCUMENTS

| | | |
|---|---|---|
| 0209374 | 1/1987 | European Pat. Off. . |
| 2105853A | 3/1983 | United Kingdom . |
| 2122753A | 1/1984 | United Kingdom . |
| 2225640A | 6/1990 | United Kingdom . |

OTHER PUBLICATIONS

Magnetic Resonance in Medicine, vol. 12, No. 3, Dec. 1989, Duluth, USA—pp. 291–305.
Proceedings Of The National Academy of Sciences of USA, vol. 79, Jun. 1982, Washington, USA—pp. 3523–3526.
Journal of Magnetic Resonance, vol. 68, 1968, Duluth, USA—pp. 367–372.

*Primary Examiner*—Michael J. Tokar
*Assistant Examiner*—Raymond Y. Mah
*Attorney, Agent, or Firm*—Harness, Dickey & Pierce

[57] ABSTRACT

In magnetic resonance spectroscopy or imaging, e.g. n.m.r. or e.s.r., a method of localizing the region of a sample from which a resonance signal is obtained by modulating the component $M_z$ of magnetization in the $B_o$ direction according to position in the sample. This is achieved by flipping the spins away from the $B_o$ direction, applying a gradient magnetic field so that they lose or gain phase according to their position, refocussing the effects of any resonance offsets including chemical shifts and subsequently returning them to the $B_o$ direction whereupon $M_z$ depends on the phase lost or gained and thus the position. This may be repeated, possibly with different gradient fields or different phase pulses, to further localize the region before a resonance signal is finally detected. The contribution to the resonance signal varies with $M_z$ and so is localized to regions of greater $M_z$.

9 Claims, 5 Drawing Sheets

MAGNETIC RESONANCE SPECTROSCOPY AND IMAGING

This invention relates to magnetic resonance spectroscopy and imaging and in particular to the localization of signals from a sample.

Nuclear magnetic resonance spectroscopy and imaging and electron spin resonance spectroscopy and imaging are widely-used techniques in medical investigations and with both techniques localization of the "field of view" to the particular volume of interest is important. A well-known localization technique is the selection of a slice of spins through the sample by applying a gradient magnetic field $B_o$ (thus making the resonant frequency a function of position in the sample) during the same period as a frequency-selective e.m. pulse is applied (Garroway, A. M., Grannell, P. K. and Mansfield, P., J. Phys.1C.7, L457 (1974)). However, the slice position is dependent on chemical shift (influence of the atomic and molecular electrons on the magnetic field experienced by the nucleus) and also other resonant offset effects and so for samples including species with varying chemical shifts (e.g. water and fat), the accuracy of the localization is reduced (the region of water contributing to the signal will be shifted slightly compared to the region of fat contributing to the signal).

Similar problems arise in electron spin resonance techniques (sometimes referred to as electron paramagnetic resonance) where although the resonant frequency is of the order of 1000 times higher, the signal may be spread over a wide spectral range.

Both n.m.r. and e.s.r. use electromagnetic excitation pulses to cause resonance of the respective magnetic dipoles and as is known for n.m.r. the excitation pulses are of radio frequency.

Phase encoding techniques are used to define position in imaging (see Kumar A, et al, 1975 NMR Fourier zeugmatography J. Magn. Reson. 18 69-83 and Edelstein W. A., et al 1980, Spin-warp NMR imaging and applications to human whole-body imaging, Phys. Med. Biol. 25 751-6) and a simplified example of a pulse sequence used in this technique is shown in FIG. 1 of the accompanying drawings. As can be seen, localization to a slice orthogonal to the z-direction is achieved by applying a gradient in the z-direction, marked $G_z$, and a 90° e.m. pulse to flip spins in a slice into the y-z plane. Localization in the x direction is obtained by sampling the e.m. FID signal emitted from the sample during application of a gradient in the x-direction, marked $G_x$. Localization in the y-direction is achieved by phase-encoding using the $G_y$ gradient applied for a set time without any measurement e.m. pulse. During the application of this gradient the phase of the rotation in the x-y plane of the nuclear spins changes by an amount depending on the magnetic field which they experience. Spins in a part of the sample with higher magnetic field tend to gain phase, spins in a part of the sample with a lower magnetic field tend to lose phase. The amount of gain or lag depends on the magnitude of field and time for which it is applied and the gain or lag is, of course, relative to the other spins in the sample. Thus after application of $G_y$ the phase of the spin will be a function of the position in the sample. By repeating the entire process with different magnitude gradients, usually 256 times, and summing and performing a Fourier transform on the result it is possible to obtain localized information in the form of an image. The effects of chemical shift are lost in the phase-encoding direction because the signal depends only on the relative phase introduced between the spins in the repetitions, and the chemical shift is the same each time.

It is possible to use phase-encoding to localize In the x-direction as well, but 256×256 repetitions would be necessary and so the time taken to perform the scans might be several hours, which is clearly inappropriate for anything other than samples which can be kept perfectly still.

For spectroscopy the number of repetitions in each direction can be reduced to 8 or 16 and this allows Fourier phase-encoding to be used as the localization technique for all three directions but the resolution is reduced (see: Proc. Natl. Acad. Sci. 79, 3523 (1982) by T. R. Brown, B. M. Kincaid and K. Ugurbil). Further, to retrieve the spatial information a 3-D Fourier transformation is required.

The present invention provides a technique where phase-preparation can be used to define a localized region or regions of the sample from which signals will be obtained, thus avoiding chemical shift or other spin resonant frequency effects, but avoiding the multiplicity of read-outs (i.e. the combination of a pulse interrogating the z-axis followed by data acquisition) required by the prior art methods using phase-encoding. This will be referred to as a Phase Encoded Selection Technique or PEST. Thus the invention uses phase-preparation to define the region of the sample from which read-out is to be obtained, rather than a frequency selective e.m. pulse combined with a gradient field. The spatial selectivity can be adjusted by repeating the preparation period a number of times prior to a single read-out.

According to one aspect the present invention provides a method of preparing the magnetization in a sample for magnetic resonance comprising phase-preparing the spins. In the sample to define a localized region or regions of the sample from which a resonance signal can be detected. The region or regions may be more sharply defined by performing a plurality of phase-preparation steps before read-out of the resonance signal.

According to another aspect the present invention provides a method of phase-preparation of the magnetization in a sample for magnetic resonance comprising applying a series of e.m. preparation pulses to the sample in the absence of a slice-selective gradient magnetic field and also applying a phase-encoding gradient magnetic field to the sample to define a localized region or regions of the sample from which signal may be obtained in a single acquisition.

According to another aspect the present invention involves applying a phase-preparation gradient magnetic field to a sample to define a localized region or regions of the sample from which resonance signal is to be obtained and subsequently applying one or more further phase-encoding magnetic field gradients each with preparation e.m. pulses but without intermediate read-out of the resonance signal, thereby to more closely define the localized region or regions.

In any of the above aspects the method may include preliminary application of a preparation e.m. pulse before each phase-encoding gradient, for instance a pulse to flip the spins into the plane orthogonal to the $B_o$ direction and may also include a refocussing pulse after the phase-preparation gradient. This may be followed by an e.m. pulse to return the spins to the $B_o$-axis. The e.m. pulses may have phases selected to act on groups of spins having particular phases. Preferably the refocussing pulse occurs at the centre of the interval between the e.m. pulse flipping the spins out of the $B_o$-axis and the e.m. pulse returning them. This timing alleviates chemical shift and other spin resonant frequency offset effects on the results. This sequence may be followed by application of a spoiling gradient magnetic field to dephase any remaining transverse components of the nuclear spins.

The preparation steps may include the application of more than one phase-preparing gradient magnetic field (each in the absence of a simultaneous e.m. pulse), for example a positive gradient for a time before the refocussing pulse and a negative gradient after (which add to the effect of the first because of the reversal the axis of spin induced by the refocussing pulse). Alternatively the gradient field may be smoothly varied throughout the time between the two "flip" e.m. pulses as long as it is low or zero during the refocussing pulse.

Following the above preparation steps an e.m. read pulse is applied and the FID resonance signal detected.

Several PEST sequences each with read-out but different preparation episodes (e.g. phase cycling) may be performed and the results (acquired signals) combined to improve the performance (e.g. the localization or tolerance to instrumental deficiencies).

Further, PEST sequences may be combined with other techniques, e.g. imaging or a localized spectroscopy sequence, to produce a desired type of scan.

The invention also provides for each of the above methods, corresponding apparatus for magnetic preparation of magnetic resonance samples having means operative to carry out the steps thereof.

The invention may be applied to both imaging and spectroscopy and may be implemented by suitable reprogramming of an existing magnetic resonance controller or by use of a dedicated hard-wired controller.

The invention will be further described by way of non-limitative example with reference to the accompanying drawings, in which.

Figure 1:
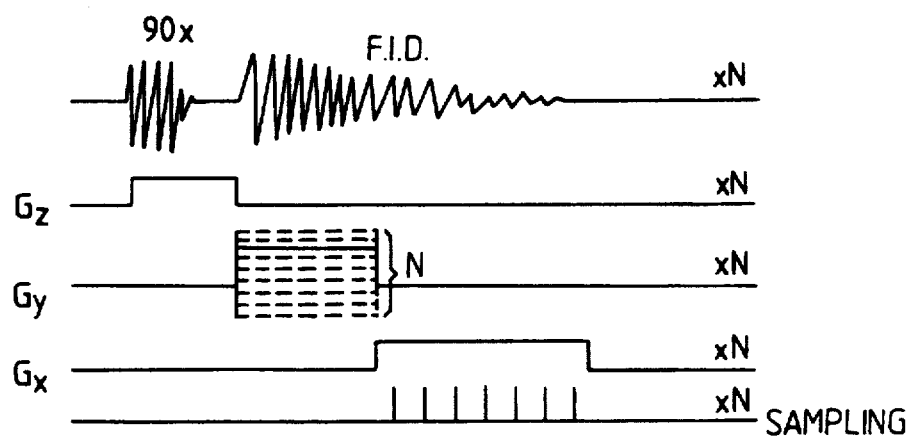
FIG. 1 shows a prior art imaging technique.
Figure 2:
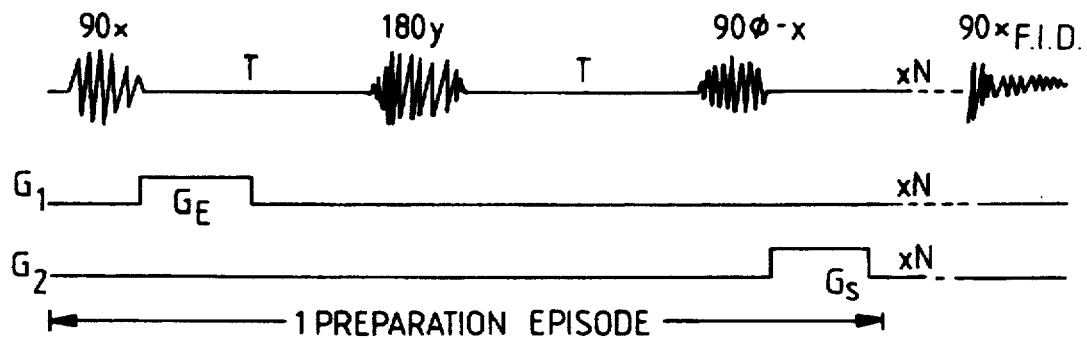
FIG. 2 shows a pulse sequence according to one embodiment of the present invention.

A basic PEST pulse sequence is illustrated in FIG. 2. It consists of a first e.m. pulse 90x, with a phase of 0° relative to the x-axis in the rotating frame of reference, which flips the spins into the x-y plane, followed by a phase-encoding gradient $G_e$. The direction of the phase-encoding gradient is chosen according to the localization required. This is followed at a time T after the 90x pulse by a refocussing pulse 180y with phase +90° relative to the x-axis which refocuses or re-phases the spins (which tend to gradually dephase due to chemical shift and $B_o$ inhomogeneities) by flipping the spins through 180°.

It should be noted that phase differences of multiples of $2\pi$ are indistinguishable and so if the phase preparation gradient is steep enough there may be several disconnected regions whose phases differ by $2\pi$ but which will contribute signal to the result.

After a further time T the spins are returned to the z-direction by a 90$\phi$-x e.m. pulse (i.e. with phase $\phi$ relative to the x-axis) such that as the spin phase progressively diverges from $\phi$, the component of magnetization returned to the z-axis, $M_z$, decreases. It is this variation in $M_z$ which is subsequently read. Then any remaining transverse components of spin are de-phased by a spoiling gradient pulse $G_s$. This sequence, with modified pulses or gradients as desired is repeated, if desired, to sharpen or more closely define the region or regions which will contribute the resonance signal. Then a 90° x e.m. pulse is applied and the resulting FID resonance signal detected.

Unlike earlier phase-encoding techniques no Fourier transform is required to decode the spatial information as the signal acquired is localized to that region or those regions with maximum $M_z$.

Figure 3:
FIG. 3 shows the result of a scan obtained following use of a preparation sequence according to FIG. 2.
Figure 4:
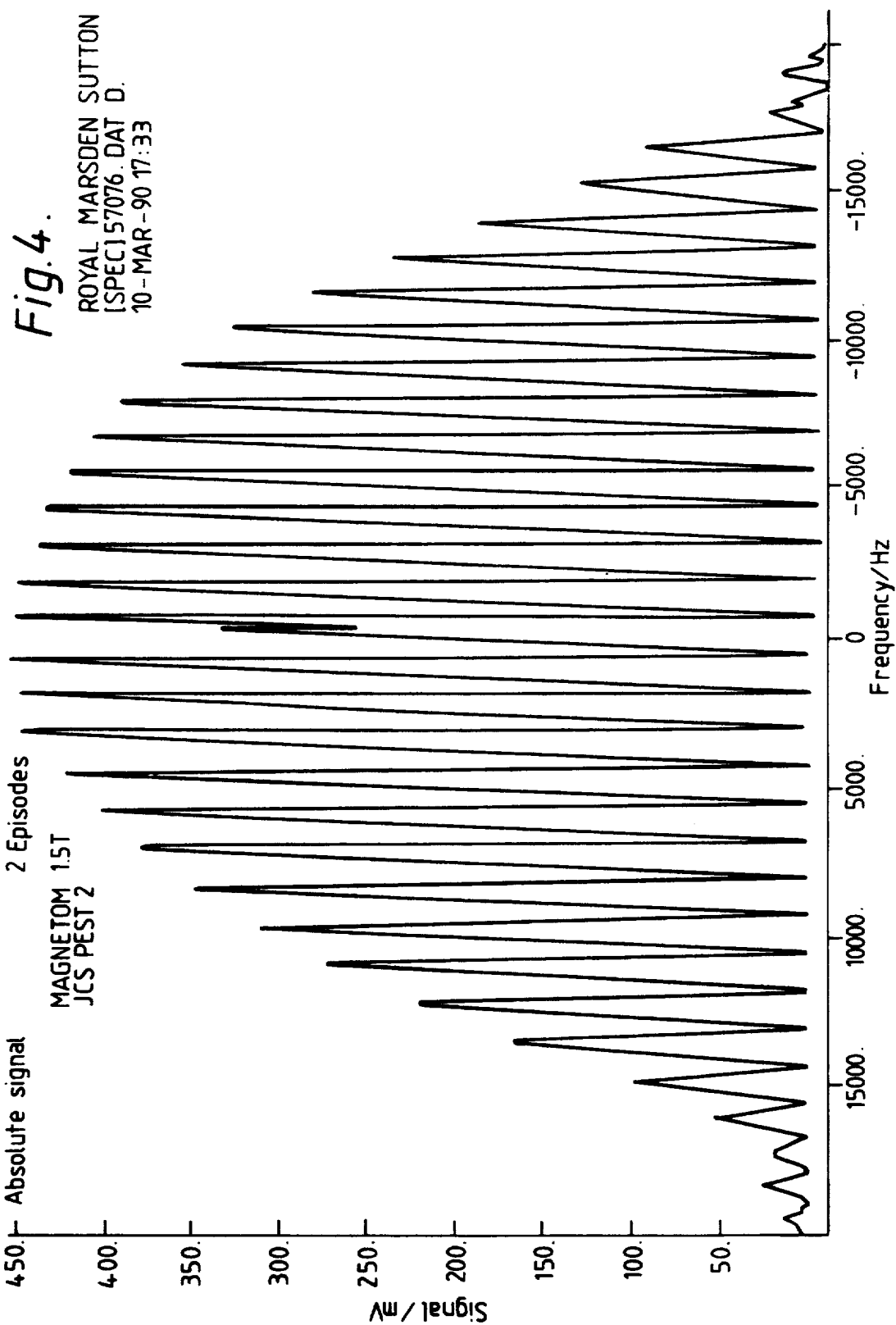
FIGS. 4–6 show the localization which can be achieved using different repeats of the preparation sequence of the present invention.
Figure 5:
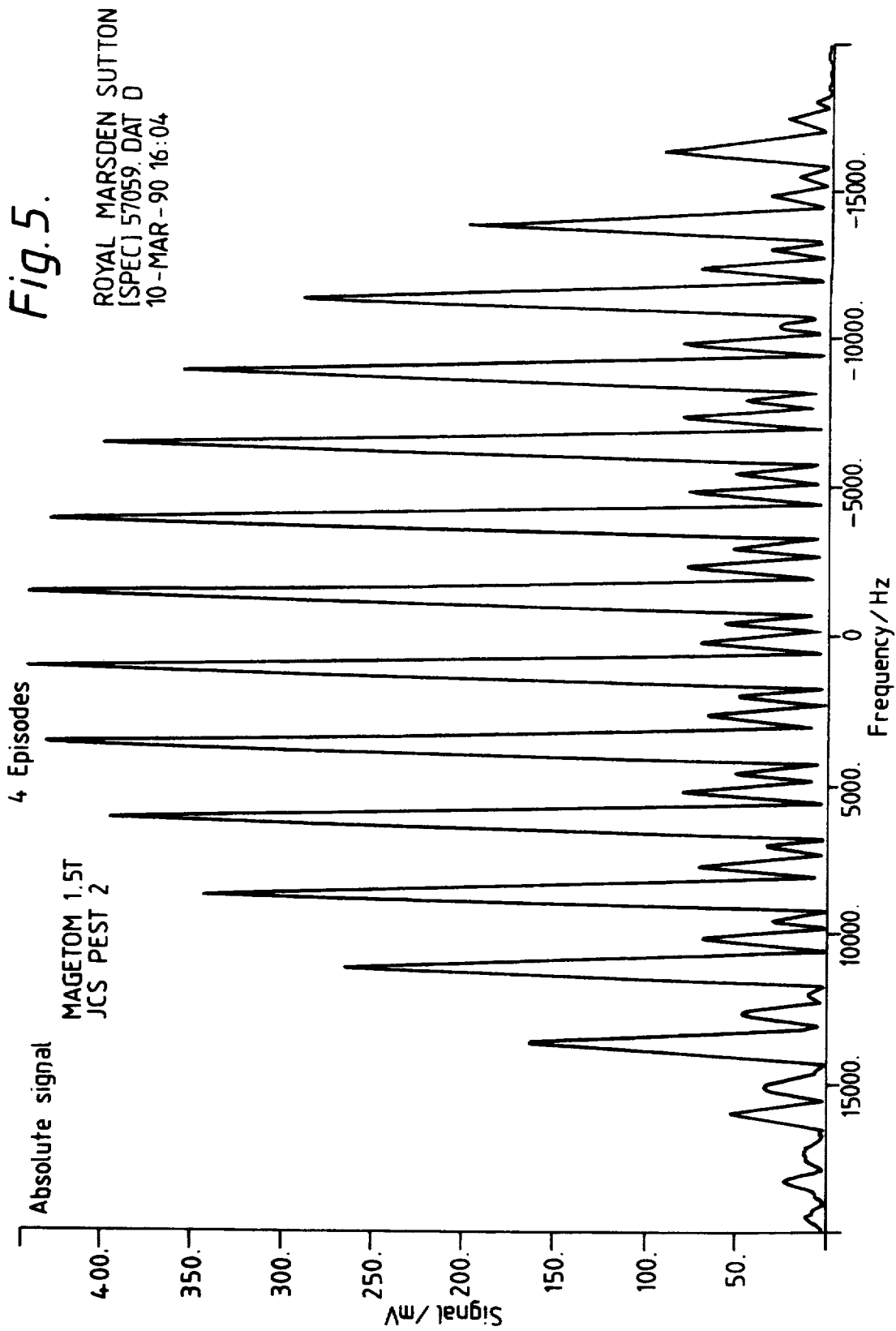
Figure 6:
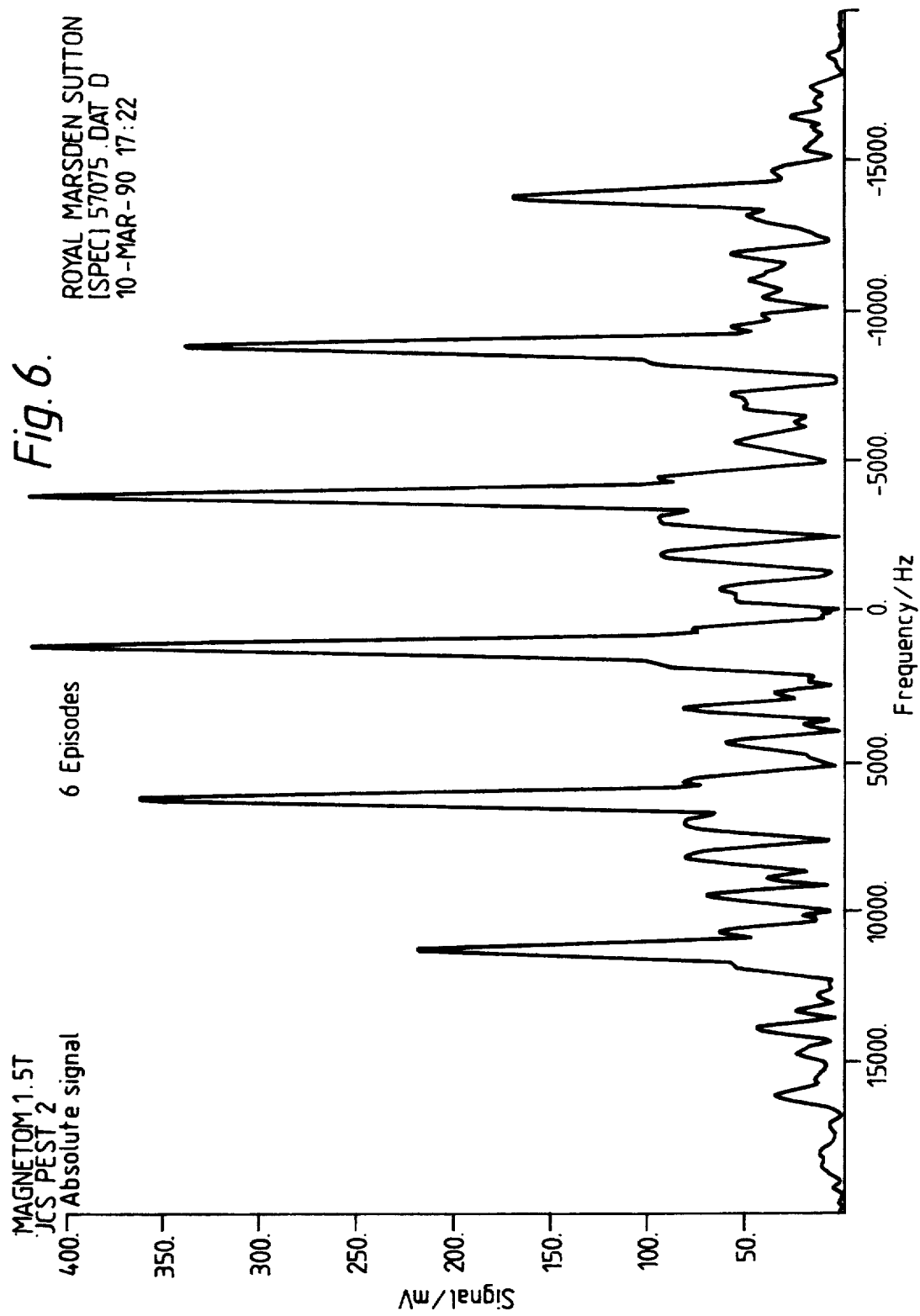

It will be noted that no gradients are applied during any of the e.m. pulses. Thus the spins in the whole sample are treated. The effect of the phase-encoding is to, modulate Mz sinusoidally with position, thus by repeated applications the desired response, localized to a region, may be built-up. FIGS. 4–6 shows how the profile can be sharper for increasing numbers of repeats. After the desired number of preparation sequences the resonance signal is obtained by for example application of a 90° e.m. pulse and the F.I.D. is detected. FIG. 3 shows an n.m.r. scan obtained with 1 preparation episode followed by an imaging sequence to read the signal. This shows an image of the selection achieved with the technique, where a phantom with oil at the top and water towards the bottom of the image was used and the technique was used to select vertical stripes. There was no chemical shift evident due to the selection the slices, although the chemical shift artifact apparent the images is due to the readout gradient used in displaying the images.

Figure 7:
FIG. 7 shows schematically a sequence of e.m. pulses used in a further embodiment of the invention.

Other preparation sequences are also possible and may improve the localization achieved with fewer repeats. For instance, a 45x - 180y - 45x-$\phi$ sequence as shown in FIG. 7 results in a sinusoidal modulation of $M_z$ over the range from $-M_o$ to zero, rather than $+M_o$ to $-M_o$ as obtained above. This is in effect a - (sine squared) function which provides superior localization compared to a sine modulariot and a single 45 - 180 - 45 sequence achieves the same effect as two 90 - 180 - 90 steps thus reducing by a factor of two the number of steps required and facilitating practical implementation. A number of variants in terms of phase and amplitude of this sequence are as follows:

| 45x  | 180y | 45x-phi  |
|------|------|----------|
| 135x | 180y | 135x-phi |
| 225x | 180y | 225x-phi |
| 135x | 180y | 45x-phi  |

The 45 - 180 - 45 sequence, and related sequences, result in a -(sine squared) $H_z$ response, whereas the 135 - 180 - 45 sequence, and related sequences, result in a +(sine squared) response, which may be less prone to the effects of T1 relaxation. The 45 - 180 - 45 sequences however may be less affected by errors in flip angles, being partially sell compensating for these errors.

The effect of the 90x - 180y - 90$\phi$-x pulse sequence can be calculated as follows:

Neglecting relaxation and using exact 90° and 180° pulses, the effect of N preparation episodes on a spin system at equilibrium (magnetization $M_o$) is given exactly by:

$$M_z(R) = M_o(r) \prod_{p=1}^{N} \{\cos(\phi(p) + k(p) \cdot r)\} \quad [1]$$

$$M_{xy}(r) = 0$$

where r is a position vector, $\phi$ is a phase angle as defined in the pulse sequence, and $k(p) = \gamma \delta G_E(p) dt$. Equations [2] & [3] give the conditions for maxima ($M_z(r_1) = M_o$) and zero ($M_z(r_2) = 0$) responses respectively (m integer):

$$\phi(p) + k(p) \cdot r_1 = m\pi \text{ (for all p) } [2]$$

$$\phi(p) + k(p) \cdot r_2 = \pi/2 + m\pi \text{ (for at least 1 p) } [3]$$

One solution of Eqn [2] resulting in a periodic one dimensional $M_z(r)$ response (N even; period $= \pi/k(N)$; one maximum at $r_1 = 0$), is given by:

$$\phi(p) = 0 \quad \text{(for all } p\text{)},$$

$$\text{and } k(p) = k(p+1) = \frac{1}{2} k(p-2) \text{ (}p\text{ odd)}.$$

For this solution the profile of the selected slice is positive everywhere and tends to a sinc$^2$ function with FWHM $\leq \pi/2k(1)$, becoming slightly narrower as N increases. Side lobes are small for N = 10 episodes, but can be minimized if required by the use of extra episodes. Slice position is determined by $\phi(p)$, as given by Eqn.[2].

The repeat episodes need not include an identical phase-preparation gradient—it can be switched in magnitude. and/or direction in order to localize differently. Similarly the return pulse can have a different phase. Further, the gradients can be in different directions so that the regions selected intersect and signal is obtained primarily from the intersection of the regions.

Thus, PEST is a single-shot $B_0$ gradient localization method which eliminates chemical shift localization errors. The technique finds particular application in n.m.r. for nuclei with a wide chemical shift range. RF power requirements are intermediate between CSI and frequency selective methods. Phase-cycled multiple volume schemes using several acquisitions are possible, due to the periodic nature of the excitation- NMR localization images can be used to select the volume, which may then be positioned under software control.

We claim:

1. A method of preparing the magnetization in a sample for magnetic resonance comprising:
    applying to the sample a first e.m. preparation pulse to flip the spins in the sample away from the $B_o$ direction,
    then applying a phase-encoding gradient magnetic field pulse of predetermined magnitude and duration to the sample to give a positional variation of phase in one direction in the sample,
    and subsequently applying second e.m. preparation pulse to the sample to return the spins to the $B_o$ direction, the phase variation encoded during the application of the phase-encoding gradient magnetic field pulse resulting in a predetermined spatial variation in magnetization along the $B_o$ axis to enable a resonance signal to be then obtained from a predetermined localized region in a single acquisition.

2. A method according to claim 1, wherein the e.m. preparation pulses are non-selective.

3. A method according to claim 1, further comprising the steps of applying one or more further episodes of e.m. preparation pulses and phase-encoding magnetic field gradients without intermediate read-out of the resonance signal whereby the localized region is more closely defined, said episodes being followed by a single acquistion to obtain a resonance signal.

4. A method according to claim 3, wherein at least one of the direction and magnitude of the phase-encoding gradient differs between repeat episodes to further localize the region of the sample from which a resonance signal will be obtained.

5. A method according to claim 1, further comprising the step of applying a re-focussing e.m. pulse to the sample.

6. A method according to claim 5, wherein the re-focussing pulse is spaced equally between the e.m. preparation pulses which respectively flip the spins away from and return the spins to the $B_o$ field direction.

7. A method according to claim 1, wherein a gradient magnetic field is applied after return of the spins to the $B_o$ direction to dephase any remaining transverse components of spin.

8. A method according to claim 1, wherein the phase of the e.m. preparation pulses is selected according to the localization required.

9. A method according to claim 1, wherein the amplitude of the preparation pulses is selected so that the phase encoding gradient modulates the magnetization component $M_z$ in the range $|M_o|$ to zero.

* * * * *

UNITED STATES PATENT AND TRADEMARK OFFICE
CERTIFICATE OF CORRECTION

PATENT NO. : 5,347,217
DATED : September 13, 1994        Page 1 of 2
INVENTOR(S) : Leach, et al It is certified that error appears in the above-indentified patent and that said Letters Patent is hereby corrected as shown below:

On the Title Page under "Other Publications", "1968" should be --1986--.

Column 2, line 5, "In" should be --in--.

Column 2, line 37, after "spins" delete --.--.

Column 2, line 37, "In" should be --in--.

Column 3, line 14, after "which" insert --will--.

Column 3, line 15, after "reversal" insert --of--.

Column 4, line 24, after "be" insert --made--.

Column 4, line 34, after "selection" insert --of--.

Column 4, line 35, after "apparent" insert --in--.

Column 4, line 45, "modulariot" should be --modulation--.

Column 4, line 59, "$H_z$" should be --$M_z$--.

Column 4, line 64, "sell" should be --self--.

Column 5, line 12, "[2]&" should be --[2] &--.

UNITED STATES PATENT AND TRADEMARK OFFICE
CERTIFICATE OF CORRECTION

PATENT NO. : 5,347,217
DATED : September 13, 1994        Page 2 of 2
INVENTOR(S) :
             Leach, et al It is certified that error appears in the above-indentified patent and that said Letters Patent is hereby corrected as shown below:

Column 5, line 38, delete "." (first occurrence).

Column 5, line 50, "-" should be --,--.

Column 6, line 11, Claim 1, after "applying" insert --a--.

Signed and Sealed this

Fifteenth Day of November, 1994

Attest:

BRUCE LEHMAN

Attesting Officer          Commissioner of Patents and Trademarks